(12) United States Patent
Spears

(10) Patent No.: US 10,822,992 B2
(45) Date of Patent: Nov. 3, 2020

(54) SYSTEMS AND METHODS FOR COLOCATION OF HIGH PERFORMANCE COMPUTING OPERATIONS AND HYDROCARBON PRODUCTION FACILITIES

(71) Applicant: BP Corporation North America Inc., Houston, TX (US)

(72) Inventor: Christopher Steele Spears, Houston, TX (US)

(73) Assignee: BP Corporation North America Inc., Houston, TX (US)

( * ) Notice: Subject to any disclaimer, the term of this patent is extended or adjusted under 35 U.S.C. 154(b) by 67 days.

(21) Appl. No.: 16/113,746

(22) Filed: Aug. 27, 2018

(65) Prior Publication Data

US 2019/0063252 A1     Feb. 28, 2019

Related U.S. Application Data

(60) Provisional application No. 62/552,129, filed on Aug. 30, 2017.

(51) Int. Cl.
| | |
|---|---|
| *F01D 15/10* | (2006.01) |
| *E21B 43/34* | (2006.01) |
| *G05B 15/02* | (2006.01) |
| *H05K 7/20* | (2006.01) |
| *H05K 7/14* | (2006.01) |

(Continued)

(52) U.S. Cl.
CPC .............. *F01D 15/10* (2013.01); *E21B 43/00* (2013.01); *E21B 43/34* (2013.01); *G05B 15/02* (2013.01); *H02K 7/1823* (2013.01); *H05K 7/1498* (2013.01); *H05K 7/20745* (2013.01); *F05B 2220/302* (2013.01); *F05B 2220/706* (2013.01)

(58) Field of Classification Search
CPC .......... E21B 43/00; E21B 43/34; F01D 15/10; G05B 15/02
See application file for complete search history.

(56) References Cited

U.S. PATENT DOCUMENTS

| | | | |
|---|---|---|---|
| 7,525,207 B2 * | 4/2009 | Clidaras .............. | F03B 13/1885 290/42 |
| 7,742,830 B1 * | 6/2010 | Botes .................... | G06F 9/4843 700/32 |

(Continued)

FOREIGN PATENT DOCUMENTS

EP     3255365 A1 *   12/2017 ............. B63B 35/44

OTHER PUBLICATIONS

Natgas. Processing Natural Gas. Sep. 25, 2013. http://naturalgas.org/naturalgas/processing-ng/. Accessed Dec. 23, 2019. (Year: 2013).*

(Continued)

*Primary Examiner* — Rocio Del Mar Perez-Velez
*Assistant Examiner* — Vi N Tran
(74) *Attorney, Agent, or Firm* — John L. Wood

(57) ABSTRACT

A hydrocarbon production system includes a well at a remote location. The well is configured to produce hydrocarbon production fluids comprising natural gas. The system also includes a turbo-generator coupled to the well and configured to receive the natural gas and produce electricity from the natural gas. In addition, the system includes a high performance computing (HPC) data center coupled to the turbo-generator and configured to be powered by the electricity from the turbo-generator.

22 Claims, 6 Drawing Sheets

(51) Int. Cl.
*H02K 7/18* (2006.01)
*E21B 43/00* (2006.01)

(56) References Cited

U.S. PATENT DOCUMENTS

| | | | |
|---|---|---|---|
| 8,683,823 B1 * | 4/2014 | Shivers, III | F25J 1/0288 |
| | | | 62/611 |
| 8,832,476 B2 * | 9/2014 | Fan | G06F 1/329 |
| | | | 713/310 |
| 8,849,469 B2 | 9/2014 | Belady et al. | |
| 9,100,089 B1 * | 8/2015 | Wise | H04B 7/18513 |
| 9,310,855 B2 | 4/2016 | Godrich et al. | |
| 9,342,375 B2 | 5/2016 | Hyser et al. | |
| 9,383,791 B1 | 7/2016 | Fan et al. | |
| 2013/0160059 A1 * | 6/2013 | Wittenschlaeger | H04B 7/1851 |
| | | | 725/68 |
| 2014/0096837 A1 * | 4/2014 | Belady | F16L 55/0333 |
| | | | 137/14 |
| 2015/0321739 A1 * | 11/2015 | Dehlsen | B63G 8/001 |
| | | | 165/45 |

OTHER PUBLICATIONS

Iron Bridge Resources News Release, "Cryptocurrency Mining Operation Launched by Oil and Gas Producer Iron Bridge Resources" Jan. 22, 2018.

\* cited by examiner

SYSTEMS AND METHODS FOR COLOCATION OF HIGH PERFORMANCE COMPUTING OPERATIONS AND HYDROCARBON PRODUCTION FACILITIES

CROSS-REFERENCE TO RELATED APPLICATIONS

This application claims benefit of U.S. provisional patent application Ser. No. 62/552,129 filed Aug. 30, 2017, and entitled "Systems and Methods for Colocation of High Performance Computing Operations and Hydrocarbon Production Facilities," which is hereby incorporated herein by reference in its entirety.

STATEMENT REGARDING FEDERALLY SPONSORED RESEARCH OR DEVELOPMENT

Not applicable.

BACKGROUND

The disclosure relates generally to systems and methods for collocating high performance computing operations and hydrocarbon production operations. More particularly, the disclosure relates to systems and methods for leveraging energy from stranded gas (e.g., associated gas) produced in connection with onshore and offshore hydrocarbon production wells to power energy intensive computing operations in remote locations.

During the production of oil from an oil well, natural gas dissolved in the oil or as a free gas cap above the oil reservoir is often produced. Such gas is commonly referred to as "associated gas," and is considered a production by-product. Methane, which is flammable, represents the primary component of associated gas. Consequently, at production sites where the associated gas cannot be brought to market due to economics or lack of a transport infrastructure, it may be flared (i.e., burned) at the production site or re-injected into the oil well.

BRIEF SUMMARY OF THE DISCLOSURE

Embodiments of hydrocarbon production systems are disclosed herein. In one embodiment, a hydrocarbon production system comprises a well at a remote location. The well is configured to produce hydrocarbon production fluids comprising natural gas. The hydrocarbon production system also includes a turbo-generator coupled to the well at the remote location and configured to receive the natural gas and produce electricity from the natural gas. In addition, the hydrocarbon production system comprises a high performance computing (HPC) data center coupled to the turbo-generator at the remote location and configured to be powered by the electricity from the turbo-generator.

Embodiments of distributed high performance computing systems are disclosed herein. In one embodiment, a distributed high performance computing (HPC) system comprises a plurality of high performance computing (HPC) data centers. Each HPC data center is disposed at a remote location. The distributed HPC system also comprises a computing allocation system communicatively coupled to each HPC data center. In addition, the distributed HPC system comprises a turbo-generator disposed at each remote location and configured to generate electrical power from natural gas produced by a well at the corresponding remote location and supply the electrical power to the corresponding HPC data center. The computing allocation system is configured to determine an available computing capacity at each HPC data center and assign at least one of a plurality of inputs to each HPC data center based on the available computing capacity at the corresponding HPC data center.

Embodiments of methods for performing high performance computing operations are disclosed herein. In one embodiment, a method for performing high performance computing (HPC) operations comprises (a) producing hydrocarbon production fluids from a well at a first remote location. The hydrocarbon production fluids comprise natural gas. The method also comprises (b) producing electrical power with the natural gas at the first remote location. In addition, the method comprises (c) powering a first high performance computing (HPC) data center at the first remote location with the electrical power.

Embodiments described herein comprise a combination of features and characteristics intended to address various shortcomings associated with certain prior devices, systems, and methods. The foregoing has outlined rather broadly the features and technical characteristics of the disclosed embodiments in order that the detailed description that follows may be better understood. The various characteristics and features described above, as well as others, will be readily apparent to those skilled in the art upon reading the following detailed description, and by referring to the accompanying drawings. It should be appreciated that the conception and the specific embodiments disclosed may be readily utilized as a basis for modifying or designing other structures for carrying out the same purposes as the disclosed embodiments. It should also be realized that such equivalent constructions do not depart from the spirit and scope of the principles disclosed herein.

BRIEF DESCRIPTION OF THE DRAWINGS

For a detailed description of various exemplary embodiments, reference will now be made to the accompanying drawings in which.

DETAILED DESCRIPTION OF THE PREFERRED EMBODIMENTS

Figure 1:
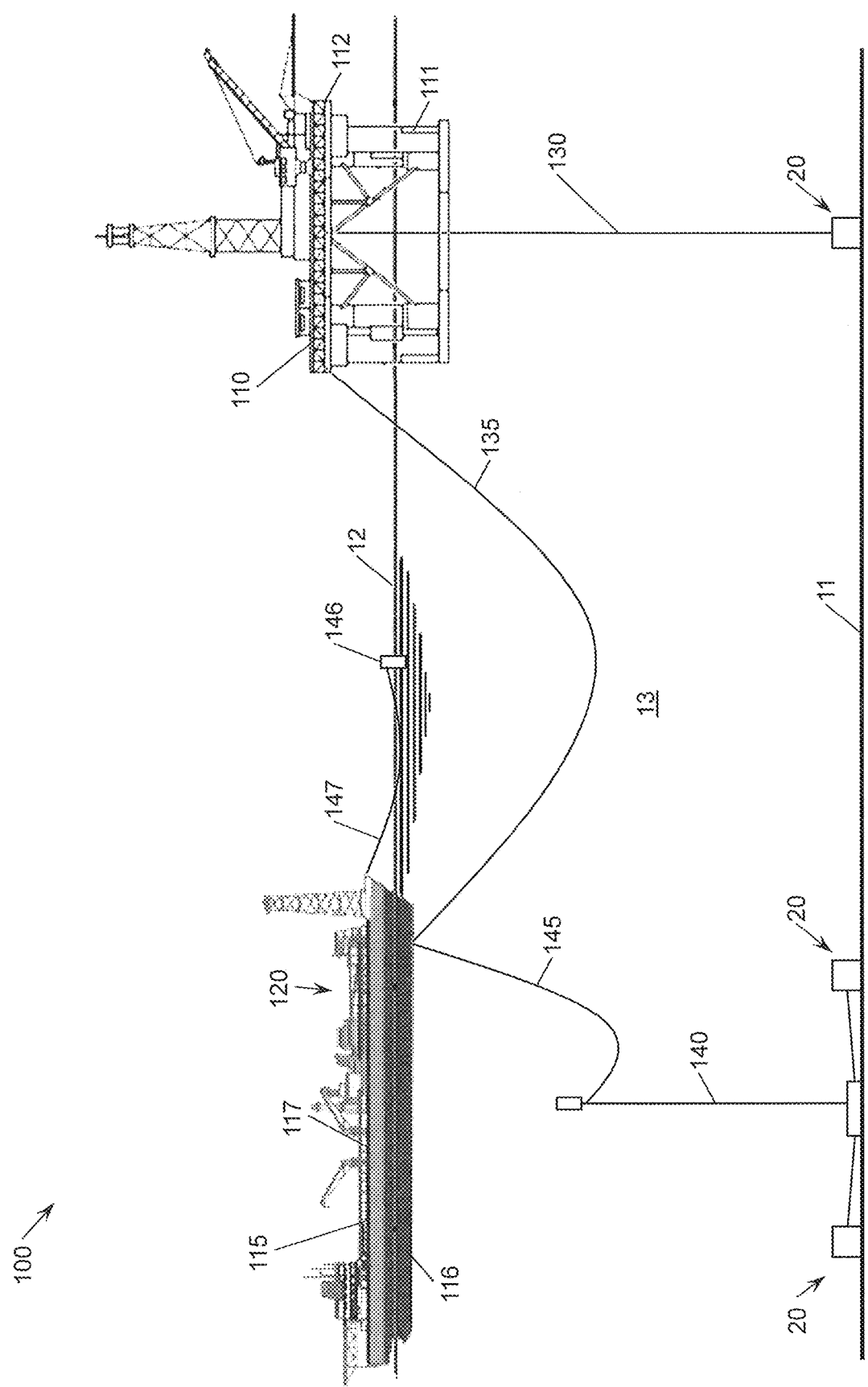
FIG. 1 is a side view of an embodiment of a hydrocarbon production system in accordance with the principles described herein.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection of the two devices, or through an indirect connection that is established via other devices, components, nodes, and connections. In addition, as used herein, the terms "axial" and "axially" generally mean along or parallel to a particular axis (e.g., central axis of a body or a port), while the terms "radial" and "radially" generally mean perpendicular to a particular axis. For instance, an axial distance refers to a distance measured along or parallel to the axis, and a radial distance means a distance measured perpendicular to the axis. Any reference to up or down in the description and the claims is made for purposes of clarity, with "up", "upper", "upwardly", "uphole", or "upstream" meaning toward the surface of the borehole and with "down", "lower", "downwardly", "downhole", or "downstream" meaning toward the terminal end of the borehole, regardless of the borehole orientation. As used herein, the terms "approximately," "about," "substantially," and the like mean within 10% (i.e., plus or minus 10%) of the recited value. Thus, for example, a recited angle of "about 80 degrees" refers to an angle ranging from 72 degrees to 88 degrees.

High performance computing (HPC) refers to the practice of aggregating computer power (e.g., the use of parallel processing) to enhance computing power, performance, efficiency, and reliability. Many research institutions and corporations leverage high performance computing to perform complex operations and solve large problems in science, engineering, math, and business. Data centers that conduct high performance computing consume relatively large quantities of electricity to perform energy intensive operations. Typically, the electricity consumed by HPC data centers is provided by local electrical grids (i.e., interconnected networks for delivering electricity from electricity producers to consumers).

Some hydrocarbon production wells (oil and gas production wells) produce "stranded gas," which is produced natural gas that is wasted (e.g., flared), re-injected into one or more of the well, or otherwise unused due to physical and/or economic reasons (e.g., the value of the gas is less than the cost to transport it to market, no gas pipeline is in place to transport the gas to market, etc.). Associated gas that cannot be brought to market can generally be considered a type of stranded gas as associated gas is effectively wasted (e.g., flared) or unused (e.g., re-injected). It is estimated that about 3.5% of all natural gas produced in the world is flared. This represents a substantial amount of lost or wasted energy. It is also estimated that remote or stranded gas reserves range from about 40% to 60% of the world's proven gas reserves. This represents a substantial amount of potentially unused or wasted energy. As will be described in more detail below, embodiments of systems and methods described herein co-locate high performance computing (HPC) data centers with hydrocarbon production sites that produce stranded gas (e.g., associated gas) to leverage the energy from the stranded gas that would otherwise be wasted or unused to power the HPC data centers.

Referring now to FIG. 1, a hydrocarbon production system 100 is shown. In general, system 100 produces hydrocarbons (e.g., oil and/or gas) from a subterranean formation disposed beneath a seabed 11. As will be described in more detail below, in this embodiment, production system 100 is particularly suited to produce liquid oil that contains stranded gas, and in particular, associated gas (e.g., natural gas). Accordingly, in this embodiment, production system 100 produces oil from a plurality of subsea oil wells 20 that extend from seabed 11 into the underlying formation. As used herein, the term "oil well" refers to any well that produces one or more barrels of crude petroleum oil per 100,000 scf of gas.

Referring still to FIG. 1, production system 100 is located at a remote geographic location that has limited communication connectivity (e.g., internet connectivity), no access to a pipeline infrastructure for transporting produced natural gas (e.g., associated gas), and no access to an electrical grid capable of providing electricity to system 100. Accordingly, as used herein, the term "remote" is used to refer to a geographic location (onshore or offshore) that lacks: (i) a hardwired or hardline communication connectivity (e.g., phone, internet, etc.); (ii) a pipeline infrastructure for exporting produced natural gas; and (iii) access to an electrical grid capable of delivering electricity from a third party producer to system 10. Since a remote location does not have hardwired or hardline communication connectivity, moderate to high bandwidth communication paths for transmitting electronic data to and from the remote location are generally not available. However, as will be described in more detail below, a remote location may have capacity for low bandwidth communication of electronic data to and from the remote location. As used herein, the term "low bandwidth" refers to communication paths for the transmission of electronic data that have a peak data transfer rate of about 1.0 Mbps (up and down). As will be described in more detail below, the embodiment of production system 100 shown in FIG. 1 lacks a hardwired or hardline communication connectivity, and further, is limited to low bandwidth data communications.

Production system 100 includes a plurality of floating offshore structures 110, 115 disposed at the surface or waterline 12 of the sea 13, a plurality of production risers 130, 140 extending from the seabed 11, and a plurality of hydrocarbon transfer conduits 135, 145. In general, risers 130, 140 and conduits 135, 145 communicate hydrocarbon production fluids from subsea oil wells 20 to floating structures 110, 115.

In this embodiment, floating structure 110 is a semi-submersible platform and floating structure 115 is a Floating Production Storage and Offloading (FPSO) unit. Semi-submersible platform 110 includes a buoyant hull 111 and a topsides or deck 112 supported by hull 111 above the waterline 12. Riser 130 is a marine production riser that extends from one subsea oil well 20 to semi-submersible platform 110, and supplies hydrocarbon production fluids from that subsea oil well 20 to platform 110. Production equipment and hardware for producing oil well 20 is disposed on deck 112. FPSO unit 115 is a floating ship-shaped vessel including a buoyant hull 116 that supports a deck 117 disposed above the waterline 12. A hydrocarbon fluids processing plant 120 is disposed on FPSO unit 115 (e.g., supported on deck 117). FPSO unit 115, and more specifically plant 120 on FPSO unit 115, receives hydrocarbon production fluids from nearby platform 110 via conduit 135 and receives hydrocarbon production fluids from subsea manifold 141 via riser 140 and conduit 145. More specifically, conduit 135 extends from platform 110 to FPSO unit 120 and plant 120, and supplies hydrocarbon fluids produced to platform 110 with via riser 130 to FPSO unit 115 and plant 120. Manifold 141 is fluidly coupled to a plurality of subsea oil wells 20 that supply hydrocarbon production fluids to manifold 141. Riser 140 is a free-standing marine riser that extends from manifold 141 toward the surface 15 and is supported in a substantially vertical orientation with a buoyant module 142 (e.g., a buoy, a plurality of buoyancy cans, or the like). Conduit 145 extends from the upper end of riser 140 to FPSO unit 115, and more specifically plant 120 on FPSO unit 115. Thus, hydrocarbon production fluids flow from wells 11 to manifold 141, and then from manifold 141 through riser 140 and conduit 145 to FPSO unit 115 and plant 120.

Hydrocarbon fluids processing plant 120 of FPSO unit 115 processes the produced hydrocarbon fluids (e.g., separates water and associated gas from the crude oil) and stores the processed oil until it can be offloaded to a tanker via an offloading buoy 146 fluidly coupled to FPSO unit 115 with an offloading conduit 147. FPSO unit 115 is particularly suited for use in frontier offshore regions where there is no pipeline infrastructure in place for transporting produced hydrocarbons (oil or gas) to shore. In particular, FPSO unit 115 provides a relatively large oil storage volume, production modules for processing the production fluids, personnel accommodations, and equipment.

Figure 2:
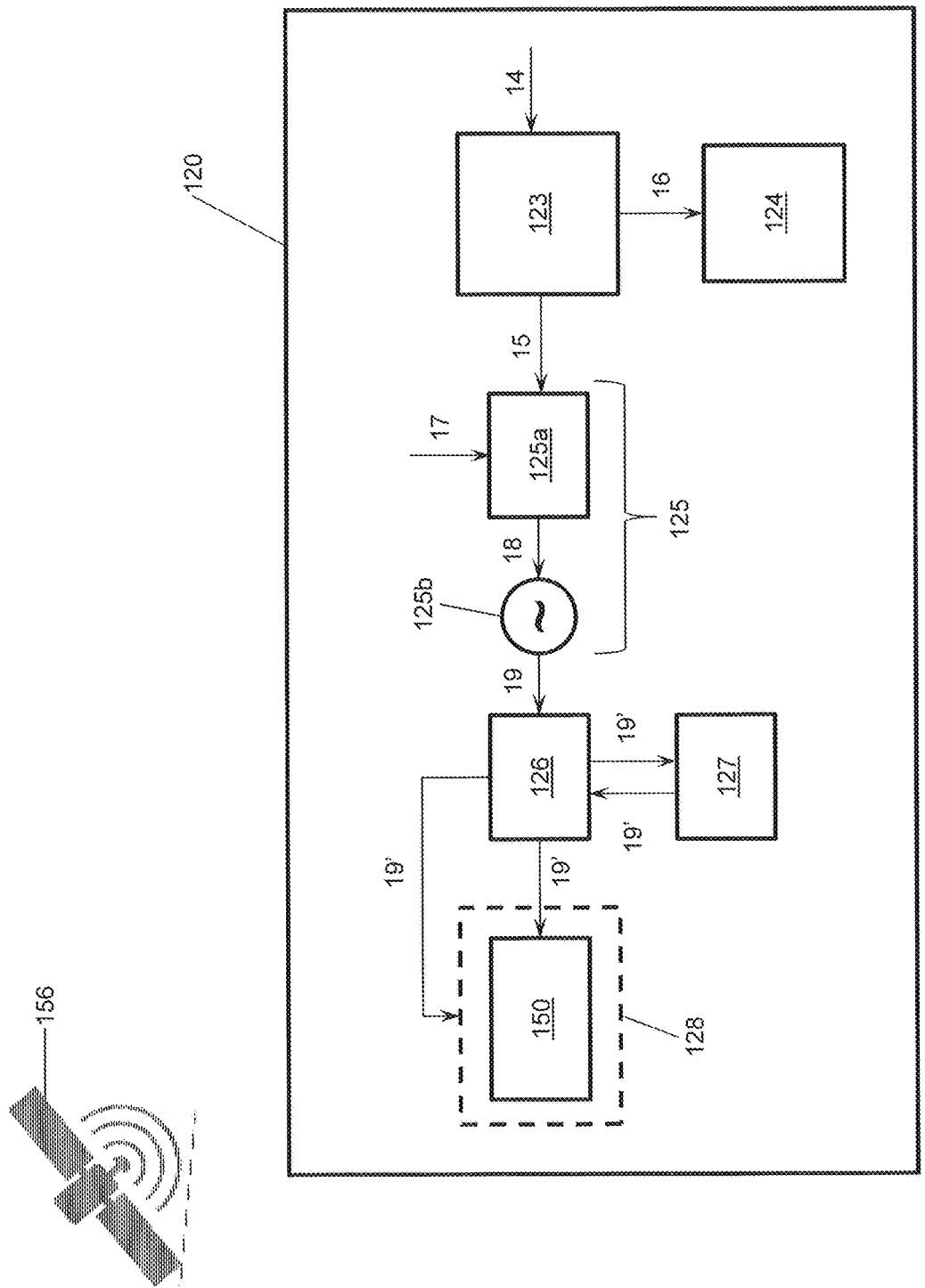
FIG. 2 is a schematic view of the Floating Production Storage and Offloading (FPSO) Unit of FIG. 1.

Referring now to FIG. 2, a schematic view of hydrocarbon fluids processing plant 120 is shown. In this embodiment, plant 120 includes hydrocarbon production fluid processing equipment 123, a processed oil storage tank 124, a turbo-generator 125, a power conditioning system 126, a power storage system 127, a heating cooling and ventilation (HVAC) system 128, and a high performance computing (HPC) data center 150. Processing equipment 123, turbo-generator 125, conditioning system 126, storage system 127, HVAC system 128 and HPC data center 150 can be disposed on deck 117, whereas oil storage tank 124 can be disposed within hull 116 of FPSO unit 115.

Unprocessed hydrocarbon production fluids 14 produced by wells 20 are supplied to processing equipment 123 of plant 120 via conduits 135, 145. Processing equipment 123 processes production fluids 14 to separate natural gas 15 (e.g., associated gas) and liquid crude oil 16 from the production fluids 14. The natural gas 15 separated from production fluids 14 is supplied to turbo-generator 125 and the liquid crude oil 16 is supplied to storage tank 124 for storage. The liquid crude oil 16 in tank 124 can be periodically offloaded from FPSO unit 115 to an oil tanker via offloading conduit 147 and offloading buoy 146. In general, processing equipment 123 can include any hydrocarbon processing system(s) or hardware known in the art for separating natural gas and liquid crude oil from hydrocarbon fluids produced from oil wells. Although processing equipment 123 is described as separating natural gas 15 and liquid crude oil 16 from production fluids 14, it should be appreciated that processing equipment can perform other processing operations such as separating water or other undesirable constituents from production fluids 14.

As previously described, production system 100 and FPSO unit 115 are at a remote geographic location, and thus, do not have access to a pipeline infrastructure for exporting the separated natural gas 15. Thus, the natural gas 15 separated from the fluids produced by oil wells 20 cannot be easily brought to market. In most conventional production operations that produce oil wells (e.g., oil wells 20) in remote locations, natural gas separated from the hydrocarbon production fluids and that cannot be brought to market is flared. In contrast, in embodiments described herein, natural gas 15 that is separated from hydrocarbon fluids 14 produced by oil wells 20 in a remote location is used to produce electricity, which in turn is used to power a local HPC data center (e.g., HPC data center 150). In particular, turbo-generator 125 receives natural gas 15 produced by processing equipment 123. Turbo-generator 125 includes a gas turbine 125a coupled to an electrical generator 125b. Turbine 125a converts energy in natural gas 15 into mechanical energy that is used to drive generator 125b. More specifically, turbine 125a receives natural gas 15 and air 17, which are combusted within turbine 125a to produce mechanical energy 18 (e.g., rotation of a rotor). The mechanical energy 18 drives generator 125b, which produces electricity 19. In general, turbine 125a and generator 125b of turbo-generator 125 can be any natural gas turbine and electrical generator, respectively, known in the art for converting natural gas into electricity. As will be described in more detail below, the electricity 19 is used to power HPC data center 150 and HVAC system 128.

The electricity 19 output from generator 125b may be in a form such as direct current (DC) that is not useable by HPC data center 150 or HVAC system 128. Accordingly, in this embodiment, power conditioning system 126 includes an inverter that converts the DC electricity 19 from generator 125b to AC electricity 19'. It should also be appreciated that the volumetric flow rate of natural gas 15 supplied to turbine 125a from processing equipment 123 may fluctuate over time. As a result, the power output of turbine 125a and the associated electricity 19 output from generator 125b may vary over time. To ensure the electricity 19' is suitable for HPC data center 150 and HVAC system 128, which may be sensitive to variations in electricity 19' (e.g., variations in the amplitude, the frequency, the voltage, the current, etc. of electricity 19'), power conditioning system 126 includes power electronics and hardware that can work with power storage system 127 to smooth fluctuations in the electricity 19' supplied to HPC data center 150 and HVAC system 128 such that it will not damage or otherwise harm HPC data center 150 or HVAC system 128. For example, power storage system 127 can store electrical power when generator 125b produces excessive electricity 19 (e.g., turbine 125a experiences a spike in power output due to a surge in natural gas 15), and power storage system 127 can provide electrical power when generator 125b produces insufficient electricity 19 (e.g., turbine 125a experiences an abrupt decrease in power output due to a sudden decrease in natural gas 15). Thus, electricity 19' supplied to HVAC system 128 and HPC data center 150 by power conditioning system 126 may be referred to as "conditioned" electricity. In general, power conditioning system 126 can include any power electronics equipment or hardware known in the art. In addition, power storage system 127 can include any equipment or hardware known in the art for storing electromagnetic energy such as batteries, one or more flywheels, capacitors, or the like.

The conditioned electricity 19 is used to power HVAC system 128 and HPC data center 150. HVAC system 128 provides heating, ventilation, and cooling to HPC data center 150 to ensure the environment surrounding HPC data center 150 is suitable for efficient operation. For example, HPC data center 150 can be disposed in a container (e.g., "containerized") with HVAC system 128 controlling the temperature and humidity within the container. In general HVAC system 128 can be any HVAC system known in the art for controlling the climate surrounding HPC data center 150.

As previously described, system 100, and hence HPC data center 150, are located in a remote geographic location, and thus, HPC data center 150 is limited to low bandwidth data communications—peak data transfer rate of about 1.0 Mbps (up and down). More specifically, in this embodiment, HPC data center 150 can send and receive electronic data via low bandwidth satellite communications.

In FIG. 2, processing equipment 123 is shown communicating all of the natural gas 15 separated from production fluids 14 to turbine 125a. However, turbine 125a may not be able to accommodate or adjust to a sufficient large, abrupt surge in natural gas 15. Accordingly, it is preferred that the natural gas outlet of processing equipment 123 be coupled to a small flare that is maintained to burn surges in natural gas 15 that cannot be accommodated by turbine 125a, thereby ensuring that any such surges in natural gas 15 are not directly released to the environment.

In the embodiment of hydrocarbon production system 100 shown in FIG. 1, hydrocarbon fluids processing plant 120 (e.g., processing equipment 123, oil storage tank 124, turbo-generator 125, power conditioning system 126, power storage system 127, HVAC system 128, and HPC data center 150) are disposed at an offshore remote location (on FPSO 115). However, in other embodiments, the HPC data center (e.g., HPC data center 150) and the components used in connection with the HPC data center (e.g., processing equipment 123, tank 124, turbo-generator 125, power conditioning system 126, power storage system 127, and HVAC system 128) can be disposed at other remote locations (e.g., on other types of offshore structures, at an onshore or land-based hydrocarbon production system, etc.). In addition, in the embodiment of hydrocarbon production system 100 shown in FIG. 1, the natural gas 15 used to drive turbo-generator 125 and ultimately power HPC data center 150 is associated gas produced in connection with oil from oil wells 20. However, in other embodiments, the natural gas used to drive the turbo-generator (e.g., turbo-generator 125) and ultimately power the HPC data center (e.g., HPC data center 150) can be produced from other forms of stranded gas (other than associated gas) from one or more oil wells, stranded gas from one or more gas wells, stranded gas from a viscous or heavy oil (e.g., bitumen) well, or combinations thereof.

As previously described, an HPC data center (e.g., data center 150) aggregates computer power (e.g., the use of parallel processing) to enhance computing power, performance, efficiency, and reliability. Processing speed (flops) is one means by which the computing power of a computing system (e.g., a single computer, a data center, etc.) can be categorized. As used herein, the terms "high performance computing" and "HPC" are used to described an integrated computer system at a discrete location (i.e., not a geographically distributed network of computers) that has a computing capacity of at least 1.0 petaflops (i.e., it can perform at least a quadrillion (thousand trillion) floating point operations per second). Thus, HPC data center 150 is an integrated computer system (e.g., data center) located at a discrete location that has a computing power of at least 1.0 petaflops.

Figure 3:
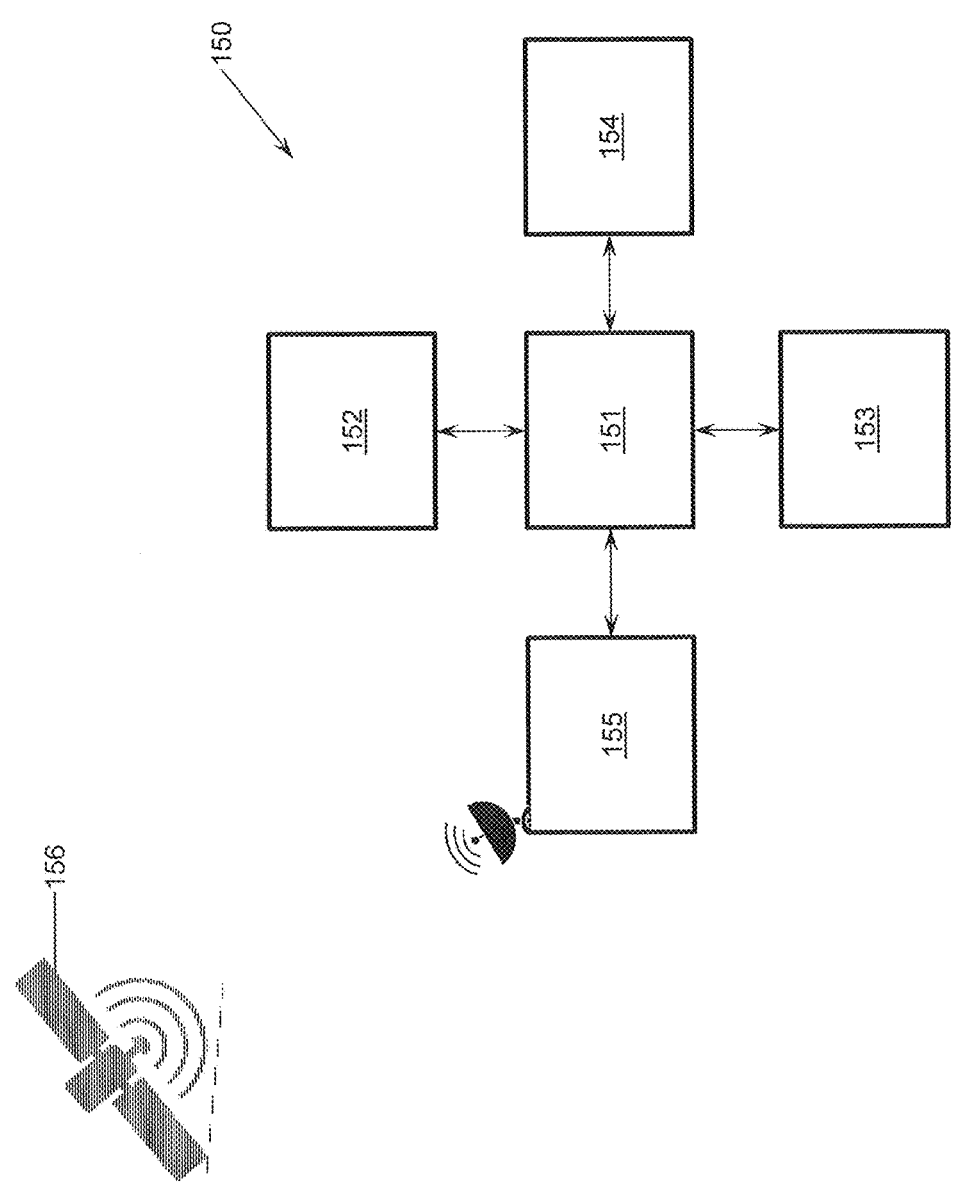
FIG. 3 is a schematic view of the HPC data center of FIG. 2.

In general, an HPC data center or computing system can include any computing hardware known in the art. For example, as shown in FIG. 3, in this embodiment, HPC data center 150 includes a central processing unit 151, one or more input/output interface(s) 152 (e.g., keyboard, mouse, display, etc.), data memory 153, program memory 154, and a communication interface 155. Processing unit 151, interface(s) 152, data memory 153, program member 154, and communication interface 155 are coupled to a system BUS that allows the transmission of electronic signals therebetween.

Central processing unit 151 refers to the data processing capability of data center 150, and as such can be implemented by one or more CPU cores, co-processing circuitry, and the like. The particular construction and capability of central processing unit 150 can be selected to provide a computing power of at least 1.0 petaflops. Data memory 153 can store input data and the results of processing executed by central processing unit 151, while program memory 154 can store the computer instructions to be executed by central processing unit 151 in carrying out those functions. Of course, this memory arrangement is only an example, it being understood that data memory 153 and program memory 154 can be combined into a single memory resource, or distributed among any number of memory resources. Typically, data memory 153 can be realized, at least in part, by high-speed random-access memory in close temporal proximity to central processing unit 151. Program memory 154 can be realized by mass storage or random access memory resources in the conventional manner. In this embodiment, communication interface 155 is a transmitter-receiver for the low bandwidth wireless communication of data between HPC data center 150 and one or more satellites 156.

Referring still to FIG. 2, HPC data center 150 performs energy intensive computing operations at the remote location with electricity 19' derived from natural gas 15. In particular, HPC data center 150 receives an input, performs computations based on the input to produce an output, and communicates the output. The input includes one or more algorithms and one or more initial data sets. The algorithms define self-contained sequences of computations to be performed by the HPC data center 150. The HPC data center 150 executes the instructions, starting with the initial data sets, to produces the output, which may be a solution, result, or the like. The input can be provided to the HPC data center 150 via wireless communications between satellite(s) 156 and communication interface 155 or via physical memory (e.g., one or more physical hard drives) physically delivered to HPC data center 150 and uploaded to HPC data center 150 via input/output interface(s) 152 (e.g., a hard drive bay). Similarly, the output produced by HPC data center 150 can be communicated from the HPC data center 150 via wireless communications between satellite(s) 156 and communication interface 155 or via physical memory (e.g., one or more physical hard drives) physically taken from HPC data center 150 to another location.

Although high performance computing operations may require extensive high-intensity computations, in some cases, the input and/or the output may have a size sufficiently small to effectively communicate via low bandwidth satellite communications. To ensure the effective and reliable transfer of files via low bandwidth communications between satellite(s) 156 and HPC data center 150, each file transferred therebetween (e.g., each input and each output) preferably has a size capable of being communicated in less than one day. For low bandwidth communications limited to peak transfer rates of about 1.0 Mbps (up and down), the maximum file size that can be communicated in less than a day is about 10 gigabytes. If the input or output is of a size unsuitable for low bandwidth satellite communications (e.g., it would take more than a day to communicate the input to HPC data center 150 or communicate the output from the HPC data center), physical delivery of the input or output via physical memory may be utilized. In general, HPC data center 150 can be used to perform any type of energy intensive high performance computations including, without limitation, seismic data processing, reservoir modeling, computational flow dynamics analysis, and blockchain/cryptocurrency mining.

In general, the greater the volumetric flow rate of natural gas 15 supplied to turbo-generator 125 (e.g., m³/s), the greater the power output of turbo-generator 125 (e.g., megawatts). It should also be appreciated that the greater the number of computations performed per second by HPC data center 150, the greater the power demands of HPC data center 150. However, the power available to HPC data center 150 (e.g., megawatts) is limited. In particular, HPC data center 150 is at a remote location and does not have access to a traditional electrical grid, and thus, is limited to the electricity 19' and associated power that can be produced by turbo-generator 125 from natural gas 15. In other words, the number of computations performed per second by HPC data center 150 may be limited by the electricity 19' and associated power that can be produced from natural gas 15 via hydrocarbon production system 100 at the specific remote location. Accordingly, the input (e.g., the algorithm(s) and initial data set) provided to HPC data center 150 is preferably selected based on the understanding that the more complex the input (e.g., the algorithms and input data set), the greater the computational speed necessary to produce the output within a given period of time, and the greater the period of time necessary to produce an output at a given computational speed. In general, the operation of HPC data center 150 is preferably optimized by providing HPC data center 150 inputs that can be solved by HPC data center 150 within the desired period of time. Thus, for example, if a first input and a second input are available, HPC data center 150 can process the first input to produce an output within one day or process the second input to produce an output within five days, and the output from the first input is needed within two days while the output from the second input is not needed within three days, the first input is preferably provided to the HPC data center 150 as it can be processed by HPC data center 150 within the desired period of time (within two days) whereas the second input cannot be processed by HPC data center 150 within the desired period of time (within three days). It should be appreciated that total computational capacity of HPC data center 150 (e.g., maximum computational speed measured in flops of an HPC data center 150) is directly related to the power output of turbo-generator 125, which in turn is a function of the volumetric flow rate of natural gas 15 to turbo-generator 125. In addition, it should be appreciated that the available operating capacity of HPC data center 150 (e.g., the available computational speed measured in flops of an HPC data center 150) is equal to its total computing capacity minus the minimum computing capacity needed to process one or more other input(s) within prescribed time periods. Thus, for example, if an HPC data center 150 has a total computing capacity of 1.5 petaflops and needs at least 0.5 petaflops to complete processing a previously assigned input within the prescribed time period (e.g., 2 days), that HPC data center 150 has an available computing capacity of about 1.0 petaflops.

Optimization of HPC data center 150 by prioritizing inputs and selecting an input to provide to HPC data center 150 based on a preferred period of time to produce the output may be particularly beneficial in cases where more than one HPC data center 150 is available to solve multiple inputs. For example, referring now to FIG. 4, an embodiment of a distributed high performance computing (HPC) system 200 is schematically shown. In this embodiment, system 200 includes a plurality of distributed HPC data centers 150 and a computing allocation system 160 communicatively coupled to each off the HPC data centers 150. Each HPC data center 150 is as previously described. Thus, for example, each HPC data center 150 is disposed at a remote geographic location (land or offshore), each HPC data center 150 is powered by a turbo-generator 125 that runs on natural gas 15 produced as a by-product from one or more oil wells 20, and the climate surrounding each HPC data center 150 is controlled with an HVAC system 128 that is also powered by natural gas 15 produced as a by-product from the one or more oil wells 20. Computing allocation system 160 communicates with each HPC data center 150 via low bandwidth satellite communications.

Figure 4:
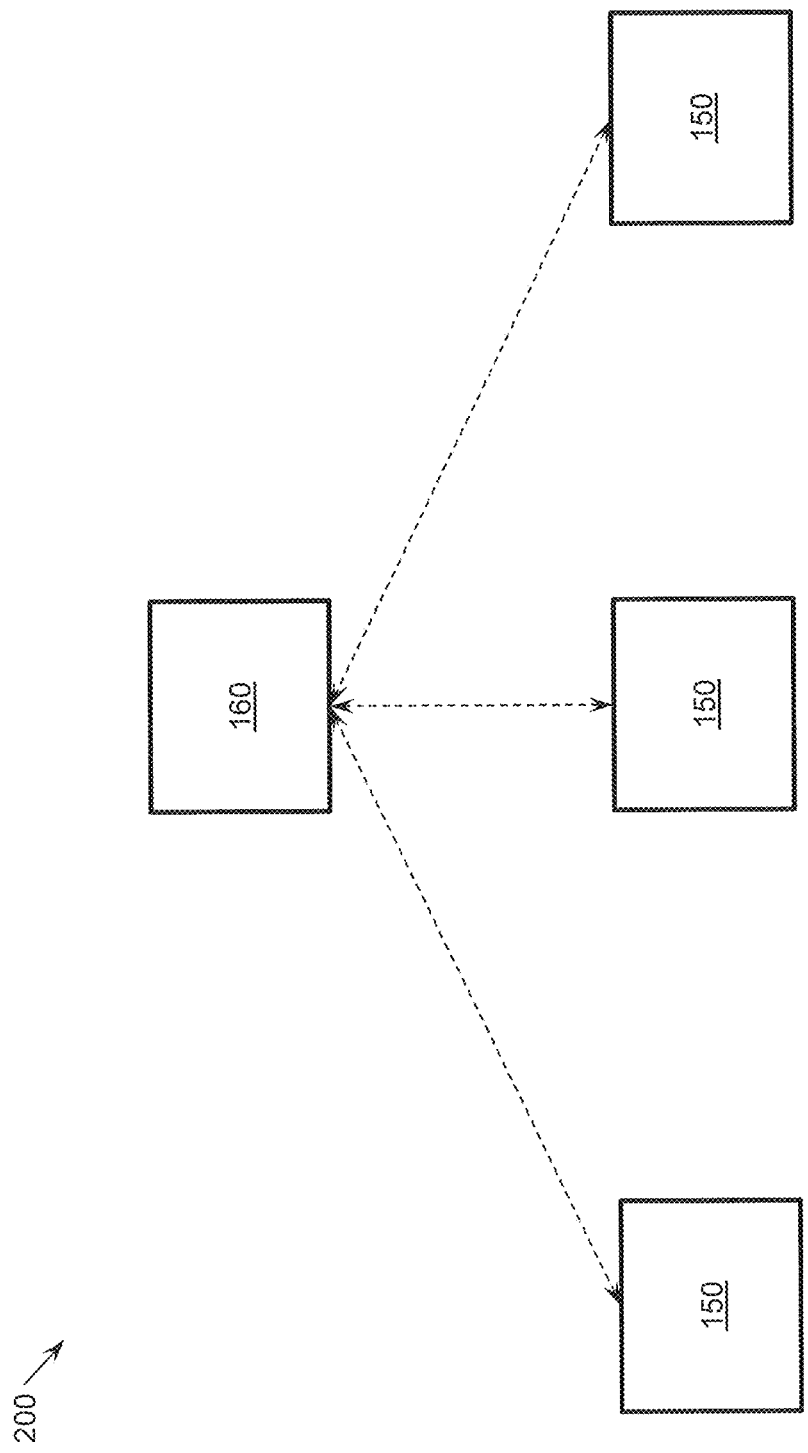
FIG. 4 is a schematic view of an embodiment of a distributed high performance computing system in accordance with the principles described herein.
Figure 5:
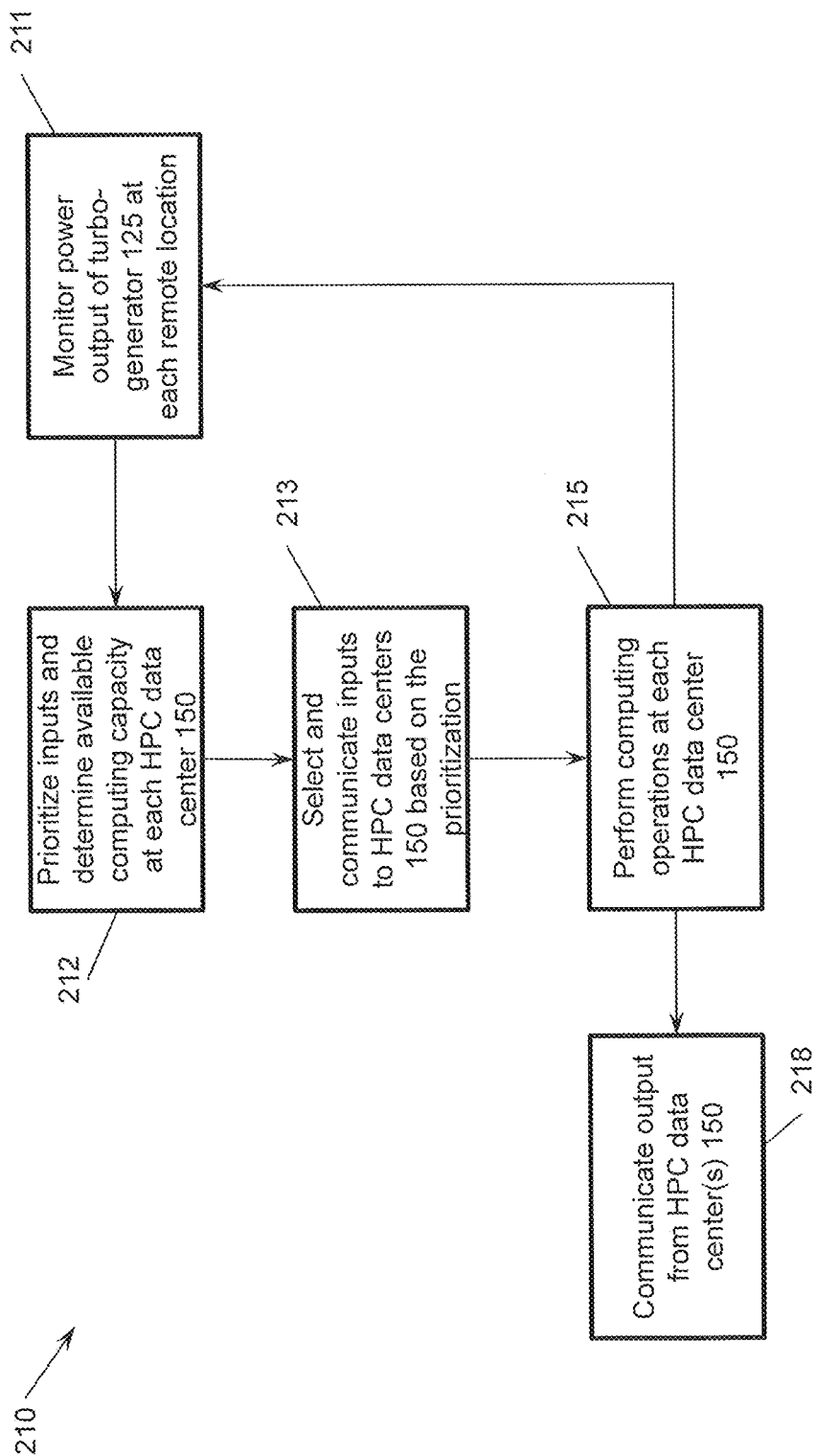
FIG. 5 is a graphical illustration of an embodiment of a method for operating the distributed high performance computing system of FIG. 4.

Referring now to FIG. 5, an embodiment of a method 210 for operating distributed HPC computing system 200 of FIG. 4 is shown. In this embodiment of method 210, computing allocation system 160 selects and allocates inputs to HPC data centers 150 based on a prioritization of the inputs and the available computing capacity of HPC data centers 150. As previously described, the total computing capacity of each HPC data center 150 is directly related to the power output of the turbo-generator 125 associated with that particular HPC data centers 150, and the available computing capacity of HPC data center 150 is its total computing capacity minus the minimum computing capacity needed to complete processing one or more previously assigned input(s) within their prescribed time periods. Thus, starting in block 211, each HPC data center 150 communicates the power output of the associated turbo-generator 125 disposed at the same remote location to computing allocation system 160. The natural gas 15 produced at the different remote locations may be different, and further, the natural gas 15 produced at a given remote location may vary over time. As a result, the power output from each turbo-generator 125 at each remote location may be different and/or vary over time. Therefore, HPC data centers 150 preferably communicate the power output of the corresponding turbo-generators 125 to computing allocation system 160 on a periodic basis. In this embodiment, each HPC data center 150 preferably communicates the power output of the corresponding turbo-generator 125 at least once per day, more preferably at least once an hour, even more preferably at least once a minute, and still more preferably at least once every second. The power output from each turbo-generator 125 is used to determine (e.g., estimate or calculate) the total computing capacity of each HPC data center 150 in system 200 based on known characteristics of each HPC data center 150 (e.g., hardware configuration) and techniques known in the art.

Moving now to block 212, computing allocation system 160 prioritizes the inputs based on prescribed time periods to complete processing each input (e.g., a first input with a prescribed completion time of less than one day may be a higher priority than a second input with a prescribed completion time of less than ten days). In block 212, computing allocation system 160 also determines the available computing capacity of each HPC data center 150 as previously described (e.g., the total computing capacity minus the minimum computing capacity needed to complete processing of previously assigned inputs within corresponding prescribed time periods).

In block 213, computing allocation system 160 compares the available computing capacity at each HPC data center 150 and selects an input for each HPC data center 150 based on the prioritization of inputs and the available computing capacity. In this embodiment, computing allocation system 160 assigns the input with the shortest prescribed time period for completion to the HPC data center 150 with the most available computing capacity, assigns the input with the second shortest prescribed time period for completion to the HPC data center with the second most available computing capacity, and so on. Next, the computing allocation system 160 communicates the selected inputs to the corresponding HPC data centers 150.

In this embodiment, computing allocation system 160 assigns inputs to HPC data centers 150 based on the prescribed time period for completion and the available capacity of the HPC data centers 150. However, in other embodiments, more complex algorithms can be used to select and assign inputs to HPC data centers 150. For instance, in some embodiments, machine learning is employed in connection with the prioritization to predict likelihood of completion based on historical operational efficiency at each HPC data center 150 including consideration of reliability of the production facilities (e.g., processing equipment 123) and well production. In such embodiments, an HPC data center 150 associated with a historically low-reliability production system would would be assigned low priority inputs.

In block 215, HPC data centers 150 perform computations based on the corresponding inputs assigned and communicated by computing allocation system 160. While HPC data centers 150 are performing computations, computing allocation system 160 continues to monitor the power output of turbo-generators 125 according to block 211, continues to prioritize new or otherwise unassigned inputs according to block 212, continues to determine the available computing capacity at each HPC data center 125 according to block 212, and continues to select and communicate inputs to HPC data centers 150 according to block 213. If computing allocation system 160 identifies an abrupt or unexpected decrease the power output of the corresponding turbo-generator 125 in block 211 and/or an abrupt or unexpected decrease in total computing capacity at an HPC data center 150 in block 212, computing allocation system 160 can consider intermediate results from that HPC data center 150 as inputs to be prioritized, assigned, and communicated to another HPC data center 150 to balance computing loads between the HPC data centers 150 within the distributed HPC system 200. Moving now to block 215, once a computing operation at each HPC data center 150 is complete, the corresponding output is communicated from the HPC data center 150 to computing allocation system 160. In this manner, HPC data centers 150 can be continuously utilized to perform computing operations and computing allocation system 160 can continuously balance the computing loads at each HPC data center 150 within the distributed HPC computing system 200.

As previously described, embodiments described herein can also be used in connection with remote on-shore or land-based hydrocarbon production operations, stranded gas produced from gas wells at remote hydrocarbon production operations, or stranded gas produced from viscous or heavy oil wells at remote hydrocarbon production operations. For example, referring now to FIG. 6, an embodiment of an onshore, land-based hydrocarbon production system 300 is shown. In this embodiment, system 300 produces hydrocarbons (e.g., oil and/or gas) from a well 20' extending from the surface 312 into the underlying subterranean formation. More specifically, in this embodiment, well 20' is a gas well that produces natural gas. As used herein, the term "gas well" refers to any well that produces less than one barrel of crude petroleum oil per 100,000 scf of gas.

Figure 6:
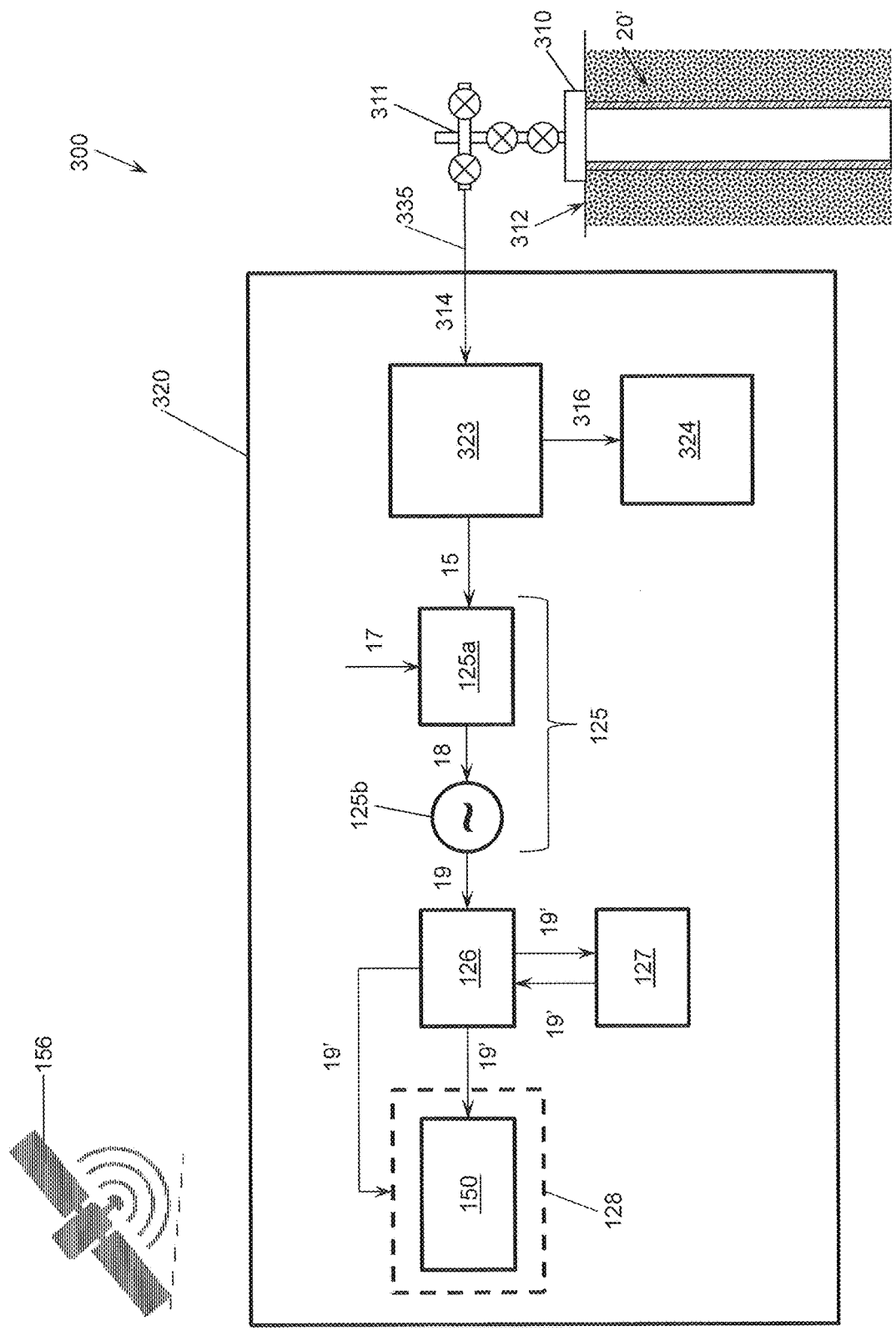
FIG. 6 is a schematic view of an embodiment of a hydrocarbon production system in accordance with the principles described herein.

Referring still to FIG. 6, production system 300 is located at a remote geographic location, and thus, has limited communication connectivity (e.g., internet connectivity), no access to a pipeline infrastructure for transporting produced natural gas, and no access to an electrical grid capable of providing electricity to system 300. In this embodiment, production system 300 includes a wellhead 310 disposed the surface 312 and defining the upper end of well 20', a production tree 311 mounted to the upper end of wellhead 310, a hydrocarbon fluids processing plant 320 proximal tree 311 (at the remote geographical location), and a hydrocarbon transfer conduit 335 extending from production tree 311 to plant 320.

In this embodiment, hydrocarbon fluids processing plant 320 includes hydrocarbon production fluid processing equipment 323, a liquid hydrocarbon storage tank 324, a turbo-generator 125, a power conditioning system 126, a power storage system 127, a heating cooling and ventilation (HVAC) system 128, and a high performance computing (HPC) data center 150. Turbo-generator 125, power conditioning system 126, power storage system 127, HVAC system 128, and HPC data center 150 are each as previously described.

Unprocessed hydrocarbon production fluids 314 produced by well 20' are supplied to processing equipment 323 of plant 320 via tree 311 and conduit 335. In this embodiment, well 20' is a gas well, and thus, unprocessed hydrocarbon production fluids 314 produced by well 20' are predominantly unprocessed natural gas. Processing equipment 323 processes the natural gas produced by well 20' (e.g., separates carbon dioxide, hydrogen sulfide, water, nitrogen, oil, hydrates, heavier hydrocarbons, or combinations thereof from the produced natural gas) to produced separated or processed natural gas 15, and converts at least a portion of the separated natural gas 15 into liquid hydrocarbons 316 (e.g., liquid natural gas (LNG), light oils, kerosene, naphtha, diesel, gasoline, or the like). In general, processing equipment 323 can include any hydrocarbon processing system(s) or hardware known in the art for separating impurities from unprocessed natural gas produced by a gas well and converting the separated, processed natural gas to liquid hydrocarbons. For example, processing equipment 323 can include conventional gas-to-liquids (GTL) processing equipment, condensing equipment (e.g., refrigeration systems), compressors, etc.

The liquid hydrocarbons 316 produced by equipment 323 are supplied to storage tank 324 for storage. The liquid hydrocarbons 316 stored in tank 324 can be periodically offloaded to a tanker truck or tanker rail car for transport from the remote geographic location to a location where they can be used, delivered to market, further processed, etc. During some operations, there may be separated natural gas 15 that is not or cannot be converted to liquid hydrocarbons 316 by equipment 323. For example, if storage tank 324 is full or the volume of gas produced by well 20' exceeds the liquid conversion capacity of equipment 323, excess separated natural gas 15 may be produced. As previously described, production system 300 and plant 320 are at a remote geographic location, and thus, do not have access to a pipeline infrastructure for exporting the excess separated natural gas 15. As a result, any natural gas 15 separated from the fluids 314 produced by oil wells 20 cannot be easily brought to market. In most conventional production operations that produce gas wells (e.g., gas well 20') in remote locations, any excess natural gas that cannot be converted to liquid hydrocarbons or brought to market is flared or vented. In contrast, in embodiments described herein, excess natural gas 15 that is separated from unprocessed hydrocarbon production fluids 314 produced by gas well 20' in a remote location is used to produce electricity, which in turn is used to power a local HPC data center (e.g., HPC data center 150). In particular, turbo-generator 125 receives any excess natural gas 15 produced by processing equipment 323. Turbine 125a of turbo-generator 125 converts energy in natural gas 15 into mechanical energy that is used to drive generator 125b, which produces electricity 19 used to power HPC data center 150 and HVAC system 128 as previously described. Power conditioning system 126 includes power electronics and hardware that can work with power storage system 127 to smooth fluctuations in the conditioned electricity 19' supplied to HPC data center 150 and HVAC system 128 such that it will not damage or otherwise harm HPC data center 150 or HVAC system 128. HVAC system 128 provides heating, ventilation, and cooling to HPC data center 150 to ensure the environment surrounding HPC data center 150 is suitable for efficient operation.

In FIG. 6, processing equipment 323 is shown communicating a portion of the natural gas 15 separated from production fluids 314 to turbine 125a. However, turbine 125a may not be able to accommodate or adjust to a sufficient large, abrupt surge in natural gas 15. Accordingly, it is preferred that the natural gas outlet of processing equipment 323 be coupled to a small flare that is maintained to burn any surges in natural gas 15 that cannot be accommodated by turbine 125a, thereby ensuring that any such surges in natural gas 15 are not directly released to the environment.

As previously described, system 300, and hence HPC data center 150, are located in a remote geographic location, and thus, HPC data center 150 is limited to low bandwidth data communications—peak data transfer rate of about 1.0 Mbps (up and down). More specifically, in this embodiment, HPC data center 150 can send and receive electronic data via low bandwidth satellite communications. In general, HPC data center 150 operates as previously described. In addition, HPC data center 150 can operate in connection with one or more other HPC data centers 150 as part of a distributed high performance computing system as previously described and shown in FIG. 4 (e.g., system 200), which can be operated as previously described and shown in FIG. 5 (e.g., method 210).

In the manner described, embodiments described herein co-locate high performance computing (HPC) data centers with hydrocarbon production operations at remote locations to utilize natural gas produced from oil or gas wells at the remote locations to power the HPC data centers as opposed to be flared. By converting natural gas to electrical power used to drive HPC data centers at remote locations, embodiments described herein provide a means to effectively export energy from remote locations that may otherwise be flared or wasted. In addition, by utilizing electrical power produced from natural gas to power HPC data centers, embodiments described herein offer the potential to more efficiently utilize natural resources while reducing electrical power demands placed on conventional power grids, thereby reducing the overall carbon footprint of those entities that operate the HPC data centers to perform complex operations and solve large problems in science, engineering, math, and business.

While preferred embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A hydrocarbon production system, comprising:
    a well at a remote location, wherein the well is configured to produce hydrocarbon production fluids comprising natural gas;
    a turbo-generator coupled to the well at the remote location and configured to receive the natural gas and produce electricity from the natural gas;
    a high performance computing (HPC) data center coupled to the turbo-generator at the remote location and configured to be powered by the electricity from the turbo-generator; and
    a heating ventilation and air conditioning (HVAC) system coupled to the turbo-generator and configured to be powered by the electricity from the turbo-generator, wherein the HVAC system is configured to control the climate surrounding the HPC data center.

2. The production system of claim 1, further comprising hydrocarbon processing equipment configured to separate the natural gas from the hydrocarbon fluids produced by the well, wherein the turbo-generator is configured to receive the natural gas from the hydrocarbon processing equipment.

3. The production system of claim 2, wherein the HPC data center is configured to send and receive data with a low bandwidth wireless communication path.

4. The production system of claim 2, wherein the remote location is offshore.

5. The production system of claim 3, further comprising a floating production storage and offloading (FPSO) unit, wherein the hydrocarbon processing equipment, the turbo-generator, and the HPC data center are disposed on the FPSO unit.

6. The production system of claim 2, wherein the well is an oil well.

7. A distributed high performance computing (HPC) system comprising:
    a plurality of high performance computing (HPC) data centers, wherein each HPC data center is disposed at a remote location;
    a computing allocation system communicatively coupled to each HPC data center;
    a turbo-generator disposed at each remote location and configured to generate electrical power from natural gas produced by a well at the corresponding remote location and supply the electrical power to the corresponding HPC data center; and wherein the computing allocation system is configured to determine an available computing capacity at each HPC data center and assign at least one of a plurality of inputs to each HPC data center based on the available computing capacity at the corresponding HPC data center.

8. The distributed HPC computing system of claim 7, further comprising:

hydrocarbon processing equipment disposed at each remote location and configured to separate natural gas from hydrocarbon fluids produced by the well at the corresponding remote location and supply the natural gas to the turbo-generator disposed at the corresponding remote location.

9. The distributed HPC computing system of claim 8, wherein the remote location of at least one HPC data center is offshore.

10. The distributed HPC computing system of claim 9, wherein the at least one HPC data center is disposed on a floating production storage and offloading (FPSO) unit at the offshore remote location.

11. The distributed HPC computing system of claim 7, wherein each HPC data center is configured to communicate the power generated by the corresponding turbo-generator to the computing allocation system at least once every hour;

wherein the computing allocation system is configured to determine a total computing capacity at each HPC data center based on the power generated at the corresponding turbo-generator.

12. The distributed HPC computing system of claim 7, wherein the computing allocation system is configured to prioritize the plurality of inputs based on a prescribed time to process each of the plurality of inputs;

wherein the computing allocation system is configured to assign the plurality of inputs based on the priority of each input and the available computing capacity at each HPC data center.

13. A method for performing high performance computing (HPC) operations, the method comprising:

(a) producing hydrocarbon production fluids from a well at a first remote location, wherein the hydrocarbon production fluids comprise natural gas;

(b) producing electrical power with the natural gas at the first remote location;

(c) powering a first high performance computing (HPC) data center at the first remote location with the electrical power;

(d) communicating the electrical power produced in (b) from the first HPC data center; and (e) determining a total computing capacity of the first HPC data center based on the electrical power produced in (b).

14. The method of claim 13, further comprising separating the natural gas from hydrocarbon production fluids produced by the well at the first remote location before (b).

15. The method of claim 14, wherein the well is a subsea oil well and the HPC data center is disposed on a floating offshore structure.

16. The method of claim 15, wherein the floating offshore structure is a floating production storage and offloading (FPSO) unit.

17. The method of claim 13, further comprising:

(f) providing an input to the HPC data center at the first remote location; and (g) performing a plurality of computations with the HPC data center at the first remote location based on the input to produce an output.

18. The method of claim 17, wherein (f) comprises wirelessly communicating the input to the HPC data center at the first remote location with a low bandwidth communication path.

19. The method of claim 18, further comprising:

(h) wirelessly communicating the output from the HPC data center at the first remote location.

20. The method of claim 13, further comprising:

(f) producing hydrocarbon production fluids a well at a second remote location, wherein the hydrocarbon production fluids produced by the second well comprise natural gas;

(g) producing electrical power with the natural gas at the second remote location; and (h) powering a second high performance computing (HPC) data center at the second remote location with the electrical power produced at the second remote location.

21. The method of claim 20, further comprising:

determining a first available computing capacity of the first HPC data center at the first remote location and a second available computing capacity of the second HPC data center at the second remote location; and assigning a first input for the first HPC data center and a second input for the second HPC data center based on the first available computing capacity and the second available computing capacity.

22. The method of claim 21, further comprising:

providing the first input to the first HPC data center and the second input to the second HPC data center;

performing a plurality of computations with the first HPC data center based on the first input to produce a first output; and performing a plurality of computations with the second HPC data center based on the second input to produce a second output.

* * * * *